United States Patent
Barr et al.

(10) Patent No.: US 7,238,881 B1
(45) Date of Patent: Jul. 3, 2007

(54) CONTROLLED HEIGHT AND FLOW REWORK NOZZLE

(75) Inventors: Gordon O. Barr, Fall River, MA (US); Ted Choinski, Worcester, MA (US); Bruce Gray, Walpole, MA (US)

(73) Assignee: EMC Corporation, Hopkinton, MA (US)

(*) Notice: Subject to any disclaimer, the term of this patent is extended or adjusted under 35 U.S.C. 154(b) by 210 days.

(21) Appl. No.: 11/007,930

(22) Filed: Dec. 9, 2004

(51) Int. Cl.
*H05K 5/00* (2006.01)
(52) U.S. Cl. ............... 174/50; 174/17 VA; 174/520; 174/547; 361/676; 361/687; 361/688
(58) Field of Classification Search ............... 174/50, 174/16.3, 16.1, 15.1, 17 R, 52.1, 521, 520, 174/17 VA, 522, 526, 547; 361/719, 704, 361/695, 600, 601, 676, 678, 687, 688, 690, 361/692, 694
See application file for complete search history.

(56) References Cited

U.S. PATENT DOCUMENTS

| 6,081,425 A * | 6/2000 | Cheng ................... 361/704 |
| 6,236,569 B1 * | 5/2001 | McEuen ................ 361/719 |
| 6,343,012 B1 * | 1/2002 | Rife ..................... 361/695 |

* cited by examiner

*Primary Examiner*—Angel R. Estrada
(74) *Attorney, Agent, or Firm*—McGuinness & Manaras LLP (57) ABSTRACT

An improved rework nozzle includes an open housing which when lowered onto the surface of a board forms a closed cavity. The housing includes venting means which expend air that is input to the cavity, thereby using flow through concepts to maintain a uniform temperature in the cavity. The housing also positioning mechanisms for both aligning a the housing and a captive integrated circuit to a desired footprint on the circuit board, and for limiting movement of the integrated circuit during rework.

14 Claims, 6 Drawing Sheets

CONTROLLED HEIGHT AND FLOW REWORK NOZZLE

RELATED APPLICATIONS

This invention may be related to application Ser. No. 11/008,005, entitled "Dual Zone Rework Nozzle" by Barr et. al. and filed on even date herewith.

FIELD OF THE INVENTION

This invention relates generally to the field of circuit board manufacturing and more particularly to a method and apparatus for circuit board rework.

BACKGROUND OF THE INVENTION

As it is known in the art, integrated circuit boards, or modules, generally comprise a number of integrated circuit packages, or dies, which are coupled via pads onto a printed circuit board (PCB) using solder. One type of integrated circuit package is a Ball Grid Array (BGA). The BGA package may be, for example, a memory chip with solder balls on the underside for mounting. The BGA package has its Input/Output (I/O) pins spread across the whole of the underside surface area in a checkerboard pattern, rather than just at the periphery. The use of BGAs allows die package size to be reduced because there is more surface area for attachment. Smaller packaging allows more components to be mounted on a module, making greater densities available.

BGAs are reflow soldered to PCBs using a mass reflow process. During the reflow process the PCBs are passed into a furnace on a conveyor system, and hot air is forced into the processing chamber through a high number of holes or nozzles and onto the PCBs passing on the conveyor system. The air then heats the PCBs to melt the solder paste alloy and form solder joints between the BGAs and the PCBs.

After the PCB is populated, it may undergo tests and be released to the field. At any time it may occur that one or more of the integrated circuits mounted on the PCB fails and needs to be replaced. When one or more of the integrated circuits fails, the module needs to be reworked. During the rework process the failing integrated circuits are removed from the module and replaced with operative integrated circuits. It is important that the integrity and reliability of the solder joints between the replacement IC and the PCB are maintained.

Figure 1:
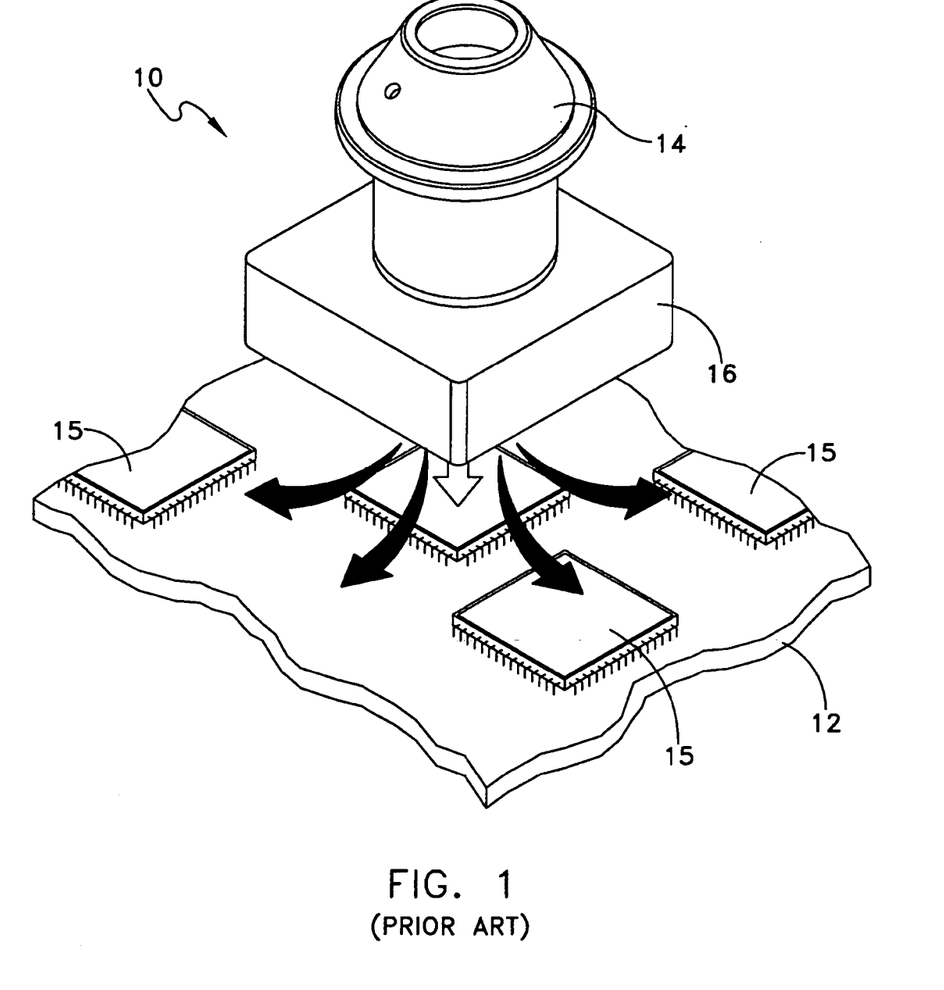
FIG. 1 is a drawing illustrating a rework nozzle and process of the prior art.

The standard approach for reworking a BGA is to place the replacement BGA into a placement nozzle and hold it into position with a vacuum cup, aligning the balls of the BGA with the solder footprint. The BGA is then dropped into position on the PCB. The placement nozzle is then partially lifted, although it may still shroud the component. As shown in FIG. 1, a flow of heated forced convention gas is applied through nozzle 14 onto the body of the component 16. The flow of air drives the heat through the component body to the solder ball array on the underside of the BGA 16, thereby melting the solder and forming a solder joint on the PCB 12.

There are several problems with the existing rework approach. One problem arises due to the density of placement of ICs on the PCB. In order to maximize the use of the PCB space the ICs are generally closely spaced. As a result, residual heat from the stream of hot air that is directed at the reworked IC may undesirably affect the solder joints of neighboring ICs, for example causing the solder connections to become liquidus, and dislodging the components from their appropriate positions on the PCB. In order to preclude this occurrence, it is often necessary to place ceramic covers, such as cover 15 over neighboring ICs.

Another disadvantage of this approach results from the natural temperature drop of the air flow on its path from the nozzle to the underside of the BGA. The initial temperature of the air should be high enough to ensure that, despite the temperature drop, the desired temperature to melt the solder between the BGA and the PCB is attained. In addition, the initial temperature may have to be adjusted even higher to accommodate the dissipation of the air flow as it is directed at the target component. For example, a starting temperature of 320 to 340 degrees or greater may be required to heat the solder interconnects to a desired 200 to 210 degrees. A problem exists in that the component 16 may not be warranted to operate effectively under these temperature conditions. For example, a typical integrated circuit may have an operating specification threshold of only 240 degrees. The additional heat can also physically distort the package. This problem is exacerbated when solder paste made from material having a higher melting temperature is used. As the trend away from lead based solder continues, this issue will rise in importance.

Another disadvantage of the current rework practice is that it makes it difficult to obtain the thermal profile of the solder set point. Very specific time and temperature values are required in order to properly establish a reliable solder interconnect. Measuring the temperatures and then adjusting the air flow, temperature and time to achieve the specific required time and temperatures facilitate thermal profiling. Because BGAs come in a great deal of sizes, the way that the air flow characteristics affect the solder set points of the BGAs are unique to each. Using an open nozzle design such as that shown in FIG. 1 forces the process of identifying the thermal profile of a given BGA to be trial and error, often taking many hours or days to establish, and can vary with different ambient conditions.

The current rework process also is also challenged by the increasing weight and densities of the BGAs and other integrated circuit components. Component weights are increasing as a result of increased power dissipation. As the weight increases it is important to increase the precision of the temperature application to the component during rework. If the temperature application is imprecise, solder shorting and collapse of the solder ball during rework may occur. Solder shorts are one of the primary defects in BGA rework. The defect is created when two connections are allowed to join during the soldering process. When a single shorting occurs, the component must be disposed. If shorting should occur multiple times, the entire board is disposed, often at significant expense.

A further problem of the existing rework process is the difficulty associated with proper alignment of the replacement BGA on the PCB. Usually a complicated vision alignment system including microscopes and mirrors is used to properly position the BGA on the PCB. The system is operator dependent, requires a high level of expertise and thus is often prone to error and misplacement. Misalignment of components is a significant defect and a common byproduct of the current rework process.

SUMMARY OF THE INVENTION

According to one aspect of the invention, a device for use in reworking a circuit board includes a housing for enclosing an integrated circuit on the circuit board. The housing includes a top face including having opening extending there through for receiving heated air flow. The housing also includes a bottom orifice defined by a lip, the bottom orifice sized to accommodate the integrated circuit device and the lip molded on at least a portion of bottom face to provide flush contact with a circuit board. The housing also includes a plurality of side faces, each side face coupled to and extending perpendicularly from the top face to the bottom orifice, wherein at least one side face includes at least one hole providing an exit path for air forwarded into the housing through the opening of the top face.

According to another aspect of the invention, an apparatus includes means for isolating a heated flow of gas directed at an integrated circuit positioned on a circuit board. The apparatus includes enclosure means, for capturing the heated flow of air as it is directed at the integrated circuit device, positioning means, for positioning the enclosure means in a desired location on the circuit board and heat dissipating means, for re-directing at least a-portion of heated-air flow away from the integrated circuit.

According to a further aspect of the invention, a method of reworking an integrated circuit on the circuit board includes the step of positioning an enclosure over an integrated circuit located on a circuit board, the enclosure including a first opening for accepting an air flow, a second opening flush with a circuit board and enclosing the integrated circuit and a third opening providing an outlet for the air flow. When the enclosure is positioned on the integrated circuit, a heated flow of air is directed into the first opening of the enclosure towards the second opening and onto a top face of the integrated circuit for heating solder on the bottom face of the integrated circuit. The heated air is expelled from the exclosure through the third opening, thereby precluding over heating of the integrated circuit.

With such an arrangement, damage to devices neighboring the integrated circuit being re-worked is minimized.

DETAILED DESCRIPTION

Figure 2:
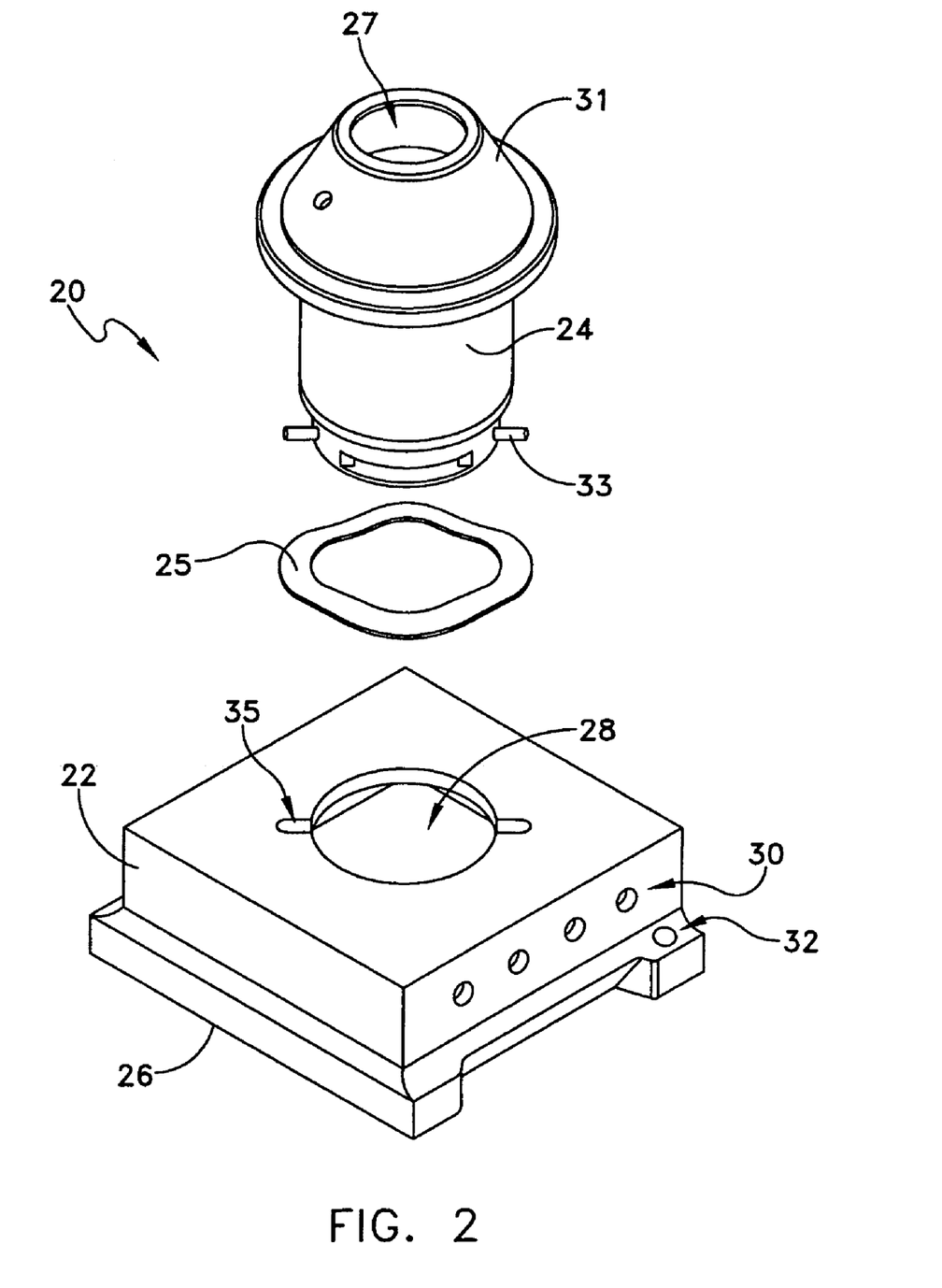
FIG. 2 illustrates an exemplary embodiment of a rework nozzle and enclosure of the present invention.

An improved re-work nozzle 20 for re-working integrated circuits is illustrated in FIG. 2. The system 20 may be used in a manufacturing or test environment to either join or detach an integrated circuit (IC) device and a printed circuit board (PCB).

The rework nozzle 20 includes a housing 22 and an air tube 24. According to one embodiment of the invention, the tube 24 is removably attached from the housing 22, for example by a twist lock arrangement including nubs 33, nub receptacles 35 and gasket 25, such that the tube extends partially into the housing. Although a nub lock mechanism is shown in FIG. 2, and described herein, it should be understood that the tube may be fixedly attached, or removably attached using a variety of other mechanisms, such as by screw engagement, etc, and the present invention is not limited to any particular method of joining the tube with the housing. The use of a removable tube, however, is advantageous as it allows for the tube to be re-used with a large variety of differently sized housings.

Although the air tube is shown having a cone shaped head 31, the present invention is not limited to any particular shape of the air tube. Rather, any tube which is adapted to receive a heated stream of air on one end and to pass the heated stream through to the housing may be substituted herein.

The housing 22 includes a top face having an opening 28 extending there through for accepting the tube 24. The bottom face of the housing is an open orifice. The sides of the housing extend downward to a lip 26 which defines a cavity into which an integrated circuit may be placed. At least two sides of the lip are molded such that their bottom faces are relatively flat, thereby permitting the housing to sit flush upon a circuit board.

At least one of the sides of the housing includes at least one hole 30. The hole 30 provides an exit path for heated air that is directed through the tube at an integrated circuit in the cavity. The flow through behavior of the air coming through the nozzle and exiting the hole 30 allows the entire component to be surrounded by heated as of the same temperature. Because the air surrounding the component is the same temperature, there are not the problems associated with the prior art temperature gradients between the surface of the IC and the solder. As a result, solder that has a higher viscous temperature characteristic may be used without endangering integrated circuit temperature tolerances.

The placement and shape of the holes is selected to direct at least a portion of the heated air away from neighboring integrated circuits to isolate the neighboring integrated circuits from re-work heat. By enclosing the IC and redirecting air flow in the manner of the present invention, the potential to damage to neighboring ICs by the rework process is minimized. Because the potential for damage is minimized, the need to provide ceramic covers on the neighboring devices is eliminated, thereby increasing the efficiency and throughput of the rework process.

According to one embodiment of the invention, the size and shape of the cavity is selected to correspond to a size and shape of an integrated circuit to be reworked. The housing also includes at least two guide holes 32. The location and shape of the guide holes is selected so that it aligns with an existing test probe hole for a corresponding integrated circuit on the printed circuit board. The guide holes 32 may advantageously be used to position the housing 22 at a desired X/Y coordinate on the circuit board. Because the circuit boards are constructed with guide holes that have a precision location to the center of the component, aligning the housing with the guide holes assists in the placement of the component on the desired footprint of the circuit board. With such an arrangement, the need for complex prior art integrated circuit placement tools is eliminated, thereby reducing the rework process cycle time and increasing rework throughput.

Figure 3:
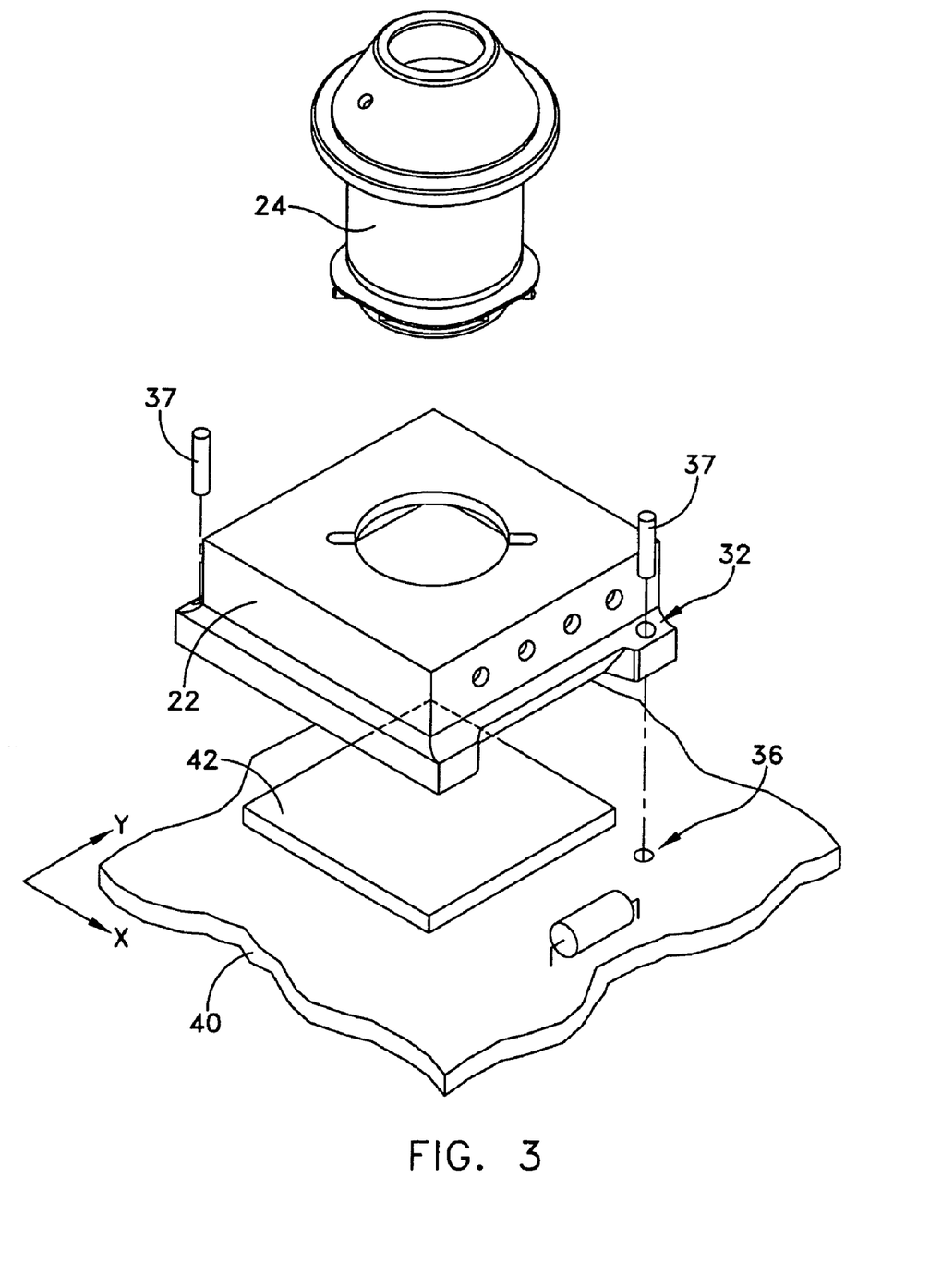
FIG. 3 is provided for illustrating a technique of mounting and aligning the rework nozzle of the present invention on a circuit board.

Referring now to FIG. 3 a diagram illustrating the placement of a housing 22 over an integrated circuit 42 on a printed circuit board 40 is shown. A guide pin 37 is here shown being forwarded through the guide hole 32 and also through a corresponding guide hole 36 in the circuit board, thereby fixing the enclosure in a desired location in the X and Y planes on the circuit board. Alternatively, a guide pin may extend through the bottom face of the circuit board, through guide hole 36, and threaded through the housing guide hole 32 to fix the housing in the desired location.

Figure 4:
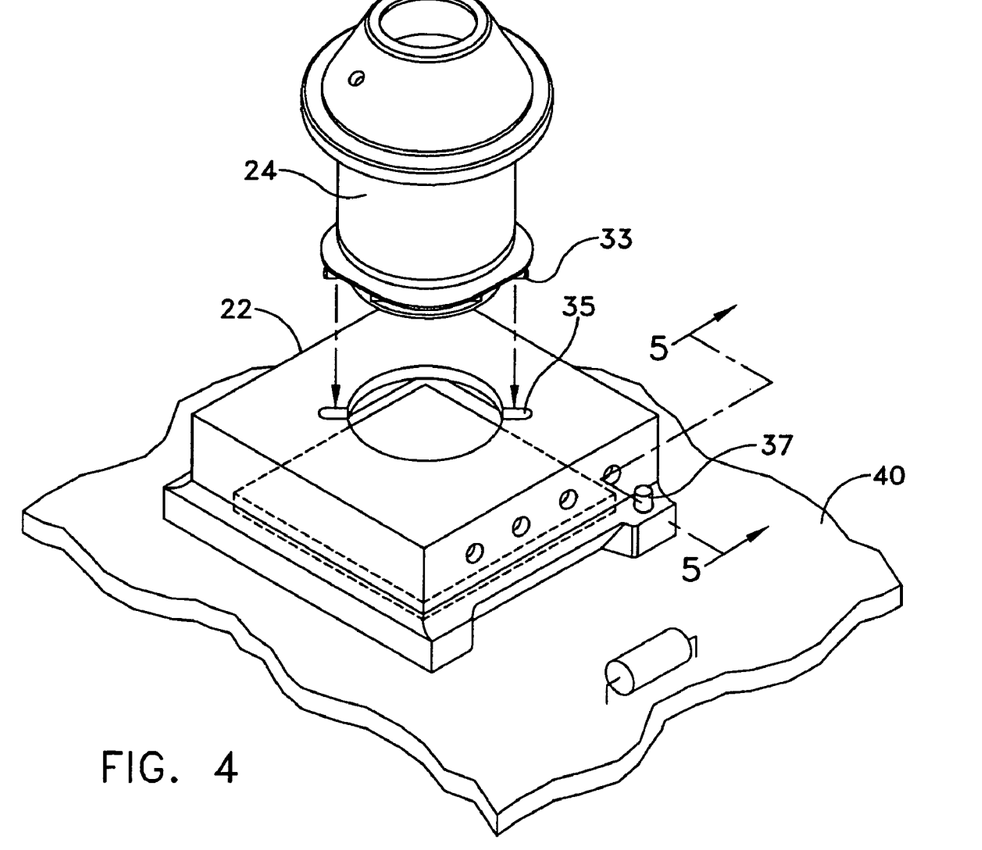
FIG. 4 illustrates the mounted housing on the integrated circuit board.

FIG. 4 illustrates the insertion of the tube 24 into the opening 28 of the housing 22. In FIG. 4 a nub and lock fixing mechanism is used, wherein the tube 24 is inserted into the opening 28 such that the nubs 33 align with the nub slots 35. Flange 39, having a circumference that is larger than that of hole 28, rests atop the top face of the housing, and the tops of the nubs fall below the bottom face of the top of the housing. The tube is locked onto the enclosure by twisting the tube to the left or the right to misalign the nubs from the nub slots. A gasket 25 helps to lock the tube.

Figure 5:
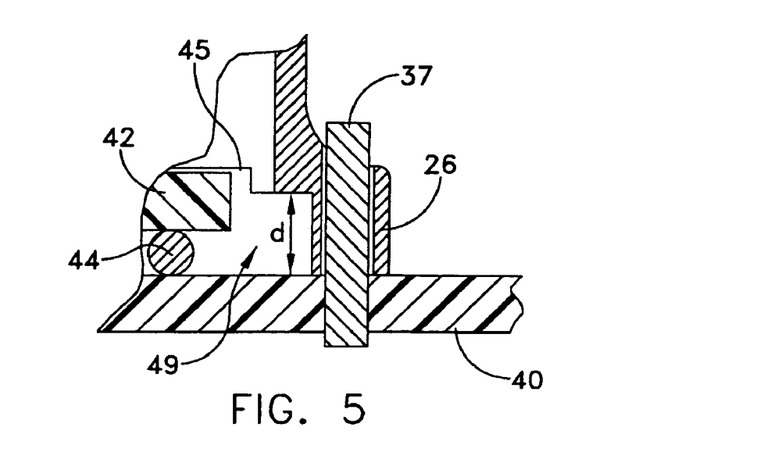
FIG. 5 is a cross-sectional view of the housing of the present invention taken along line 5 of FIG. 4, and illustrating a shelf used to limit Z axis movement of the integrated circuit during rework.

FIG. 5 is a cross section of the rework nozzle taken along line 5 of FIG. 4. As shown in FIG. 5, the lip 26 of the housing is flushly mounted on circuit board 40 to prevent the passage of hot air onto the surface of the PCB. Rather, hot air of the same temperature surrounds the integrated circuit in the cavity 49, circulating to heat the solder ball 44 to the desired set temperature. A closed cavity having specific venting capabilities thus provided. The consistency of temperature between the top and the bottom of the integrated circuit enables a clean thermal ramp during the rework process, thereby minimizing solder integrity issues. By providing a mechanism accommodating constant flow and known thermal ramp, variable sized components may be profiled by adjusting the thermal ramp period.

According to one aspect of the invention, an inner face of the housing is molded to provide a shelf which extends into the cavity. A distance d from the bottom of the shelf to the base of the lip 26 is selected in accordance with a desired movement of the integrated circuit 42 during the rework process. The lip limits the movement of the integrated circuit along the Z axis to provide control over the shape and height of an interconnect, and concomitantly the strength integrity and the consistency of the connection.

Figure 6:
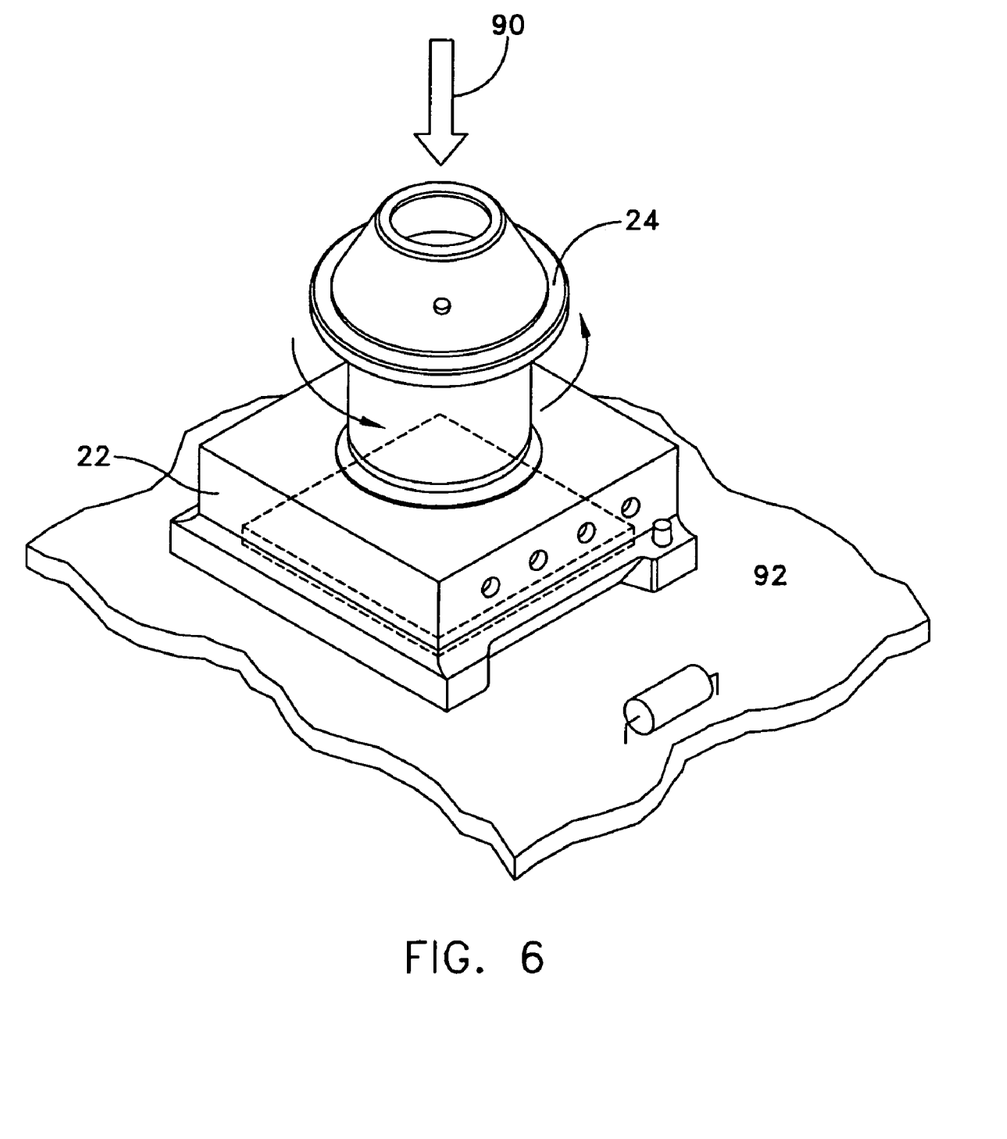
FIG. 6 illustrates a flow of air into and out of the housing of the present invention.

FIG. 6 is a diagram provided to illustrate the flow of air during the rework process. Air flow in the direction of arrow 90 is forwarded into the housing 22, heating the air within the cavity surrounding the integrated circuit, and melting the solder. The number and size of the holes 32 is selected such to enable a constant temperature to be maintained inside the cavity given a desired air flow rate into the nozzle.

Figure 7:
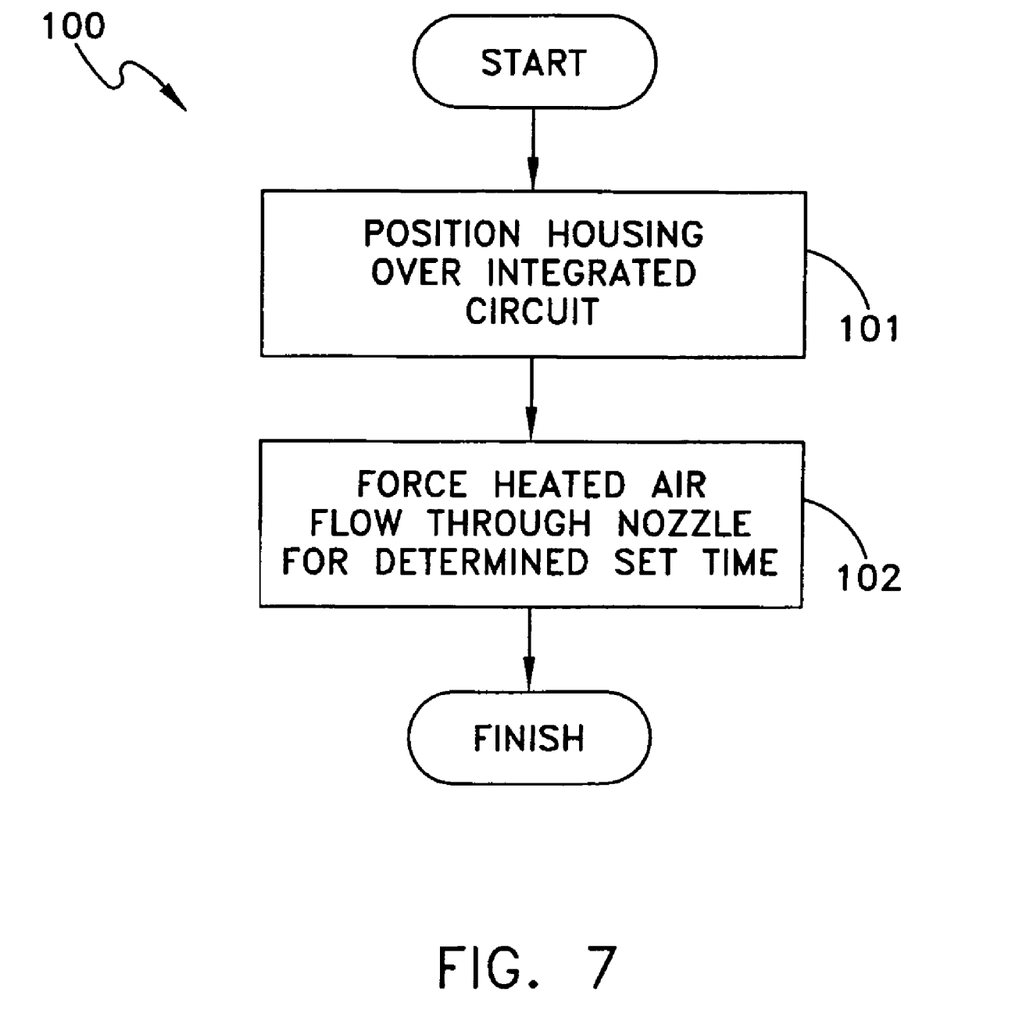
FIG. 7 is a flow diagram illustrating several steps which may be performed to rework an integrated circuit.

Referring now briefly to FIG. 7 an exemplary process for reworking an integrated circuit will now be described. At step 102 the rework nozzle is positioned on the integrated circuit board, for example by first attaching the tube to the appropriate housing, and then threading the housing through a guide pin extending through a guide hole in the circuit board. At this point the rework nozzle is positioned in a desired X and Y alignment with the integrated circuit.

At step 102 air is forced into the nozzle 22, and expended from holes 30. The temperature of the air is increased according to a predetermined thermal profile for the solder and integrated circuit combination. The traversal of this thermal profile causes the solder to become more fluid, causing expansion of the solder ball along the Z axis. The shelf within the housing limits the Z axis expansion, thereby protecting the integrity of the connections.

Accordingly an improved rework nozzle and method of use has been shown and described. The rework nozzle includes an open housing which when lowered onto the surface of a board forms a closed cavity. The housing includes venting means which expend air that is input to the cavity, thereby using flow through concepts to maintain a uniform temperature in the city. The housing also positioning mechanisms for both aligning a the house and a captive integrated circuit to a desired footprint on the circuit board, and for limiting movement of the integrated circuit during rework.

Having described an exemplary embodiment it will be appreciated that various modification to the shape and size of the components may be provided while still utilizing the basic concepts of the invention. Accordingly, the claims should not be limited to that which is described herein, but rather only by the claims, which recite:

The invention claimed is:

1. A device comprising:
   a housing including:
      a top face including an opening;
      a bottom orifice defined by a lip, the bottom orifice sized to accommodate an integrated circuit device and the lip molded on at least a portion of bottom face to provide flush contact with a circuit board on which the integrated circuit is mounted via solder; and
      a plurality of side faces, each side face coupled to and extending perpendicularly from the top face to the bottom orifice, wherein at least one side face includes at least one hole providing an exit path for heated air when heated air is forwarded into the housing through the opening of the top face, to melt the solder, wherein the hole redirects the heated air away from the integrated circuit to protect the integrated circuit from overheating.

2. The device of claim 1 wherein the lip includes at least one positioning device for aligning the housing along an X and Y axis with the integrated circuit device.

3. The device of claim 2 wherein the positioning device is a pair of through holes, and wherein a location of the through holes on the lip is selected according to a position of corresponding test through holes near the integrated circuit device on the circuit board.

4. The device of claim 1, wherein the lip includes a mechanism for limiting Z axis movement by the integrated circuit.

5. The device of claim 4, wherein the mechanism is a protrusion which extends perpendicularly into the housing from at least a portion of the lip.

6. The device of claim 1 further including a tube extending axially into the opening in the top face of the housing.

7. The device of claim 6 wherein the tube is connected to the housing.

8. An apparatus comprising:
   means for isolating a heated flow of air directed at an integrated circuit that is positioned on a circuit board via solder, the heated flow of air for melting the solder, the means for isolating the heated flow of air including:
   enclosure means, for capturing the heated flow of air as it is directed at solder of the integrated circuit device;
   positioning means, for positioning the enclosure means in a desired location on the circuit board; and
   heat dissipating means, for re-directing at least a portion of heated air flow away from the integrated circuit to protect the integrated circuit from overheating during melting of the solder.

9. The apparatus of claim 8, wherein the positioning means includes means for positioning the enclosure in accordance with a desired X/Y position of the circuit board.

10. The apparatus of claim 8, wherein the positioning means is a through hole on the enclosure means, a location of the through hole selected in accordance with a corresponding through hole near the integrated circuit on the circuit board.

11. The apparatus of claim 8, wherein the positioning means includes means for limiting a movement of the integrated circuit along a Z axis.

12. The apparatus of claim 11, wherein the positioning means includes a protrusion, mounted internal to the enclosure means.

13. The apparatus of claim 8 wherein the heat dissipating means includes at least one hole in the enclosure means.

14. The apparatus of claim 8 wherein a position of the at least two holes in the enclosure means is selected such that air flow is re-directed away from pins of the integrated circuit.

* * * * *